United States Patent
Ejima et al.

[11] Patent Number: 6,032,817
[45] Date of Patent: Mar. 7, 2000

[54] EASILY ATTACHABLE/DETACHABLE LID MOUNTED CONTAINER

[75] Inventors: Kazutoshi Ejima, Saga-ken; Yukihiro Hyobu, Tokyo, both of Japan

[73] Assignees: Sumitomo Sitix Corporation; Kakizaki Manufacturing Co., Ltd., both of Japan

[21] Appl. No.: 09/094,565

[22] Filed: Jun. 15, 1998

[30] Foreign Application Priority Data

Jun. 20, 1997 [JP] Japan .................................. 9-163878
Sep. 17, 1997 [JP] Japan .................................. 9-251724

[51] Int. Cl.⁷ .................................................. B65D 45/16
[52] U.S. Cl. ........................ 220/284; 220/324; 220/326; 220/745; 24/615; 292/83; 81/3.55
[58] Field of Search ................................... 220/324, 326, 220/315, 281, 284, 285, 835, 378, 745, 784, 786, 788, 796, 806; 206/445, 334; 292/80, 83, 87; 24/614, 615, 662, 704.1; 81/3.09, 3.15, 3.55, 3.56

[56] References Cited

U.S. PATENT DOCUMENTS

| | | | |
|---|---|---|---|
| 4,331,168 | 5/1982 | Hatakeyama | 292/83 X |
| 4,801,039 | 1/1989 | McCall et al. | 220/788 X |
| 5,040,327 | 8/1991 | Stack et al. | 220/281 X |
| 5,156,293 | 10/1992 | Petterson et al. | 220/326 |
| 5,220,712 | 6/1993 | Taki et al. | 292/83 X |
| 5,348,356 | 9/1994 | Moulton | 292/80 |
| 5,390,811 | 2/1995 | Ogino et al. | 220/326 |
| 5,657,893 | 8/1997 | Hitchings | 292/80 X |
| 5,682,910 | 11/1997 | Kizawa et al. | 220/326 X |
| 5,743,606 | 4/1998 | Scholder | 220/786 X |
| 5,788,064 | 8/1998 | Sacherer et al. | 220/281 X |

*Primary Examiner*—Nathan Newhouse
*Attorney, Agent, or Firm*—Lorusso & Loud

[57] ABSTRACT

An easily attachable/detachable lid mounted container includes a container body, a lid for covering the container body, and an easy attach/detach mechanism for reliably securing the lid to the container body and for easily detaching the lid from the container body. The easy attach/detach mechanism includes: an engagement plate provided on the lid and extending toward the container body, the engagement plate being resilient and bendable; an object engagement portion, provided on the container body, for engaging, when the lid is pressed toward the container body, with the engagement plate so as to secure the lid to the container body; and separation means, provided between the engagement plate and the object engagement portion, for separating the engagement plate from the object engagement portion when the separation means is pressed toward the container body. When the lid is removed from the container body, the separation means is pressed downward to thereby separate the engagement plate from the object engagement portion so as to release the lid, having been secured, from the container body.

6 Claims, 11 Drawing Sheets

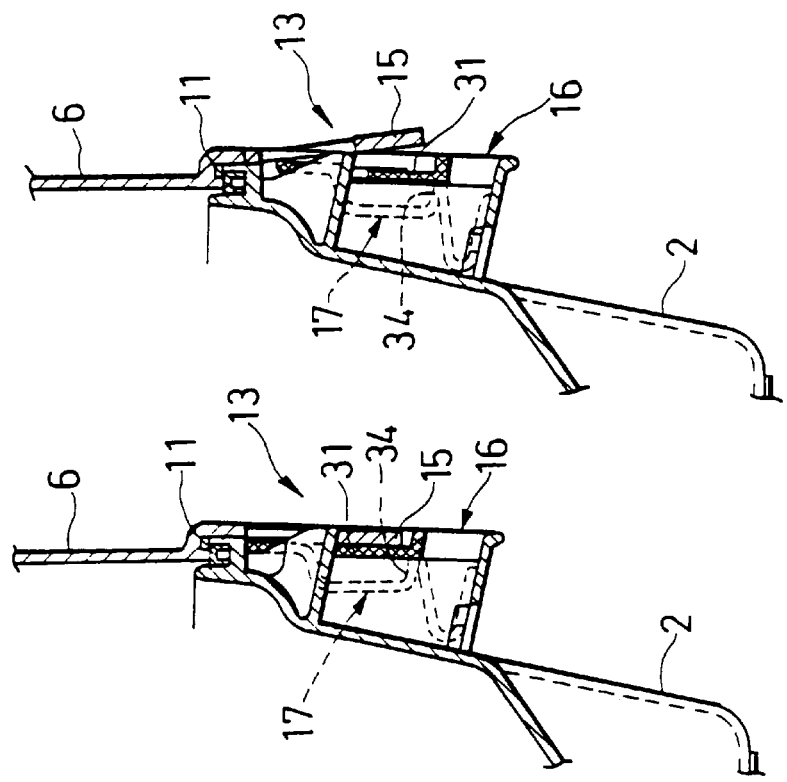
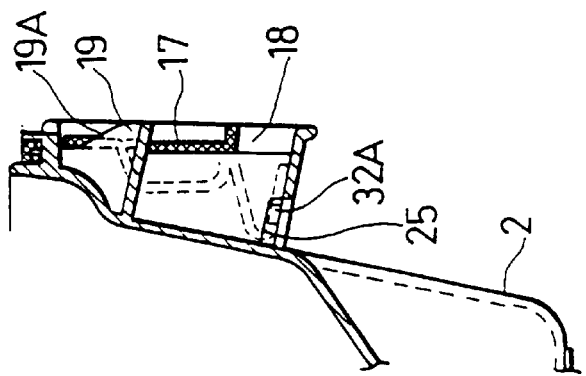
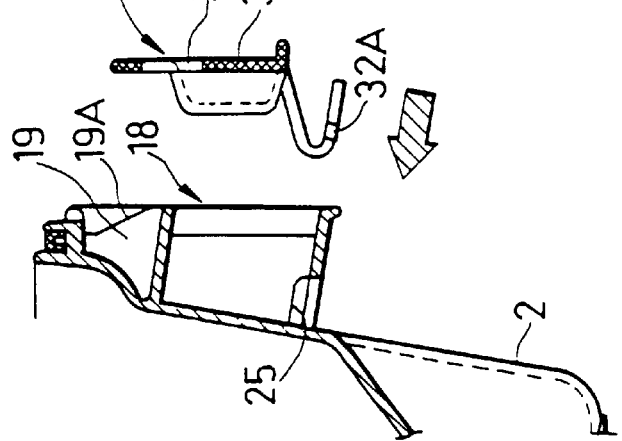

FIG. 17
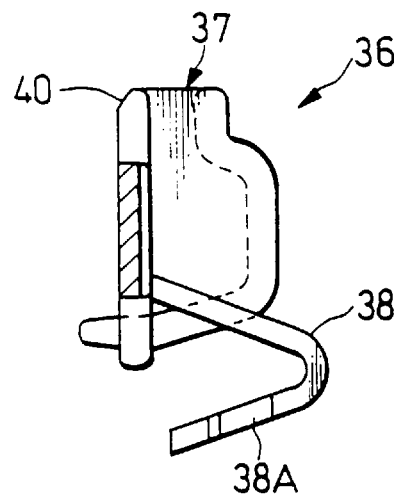
FIG. 18
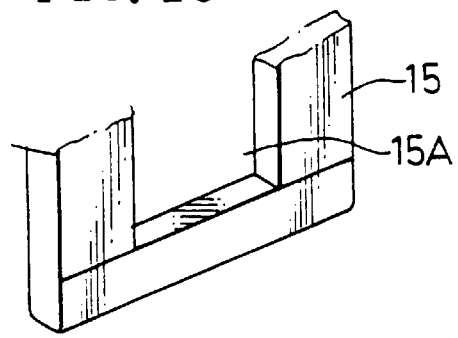
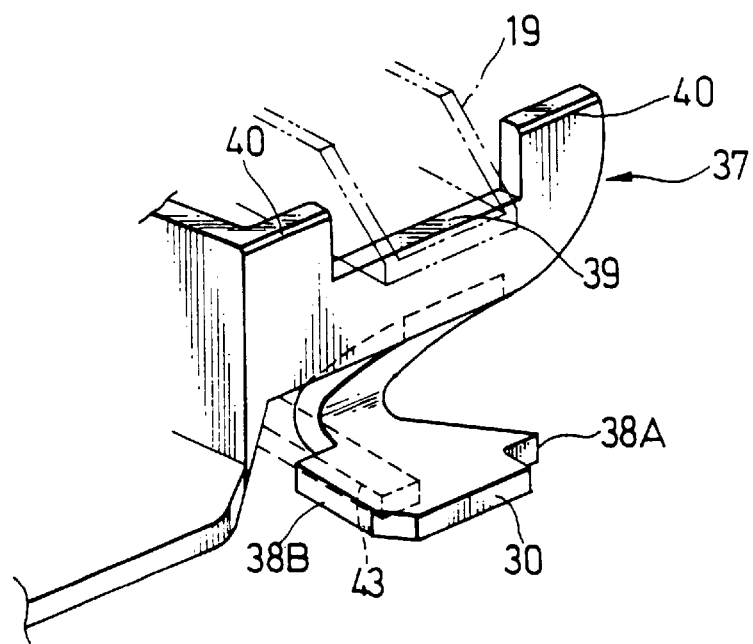

EASILY ATTACHABLE/DETACHABLE LID MOUNTED CONTAINER

BACKGROUND OF THE INVENTION

1. Field of the Invention

The present invention relates to a container with an easily attachable/detachable lid (referred to as "easily attachable/detachable lid mounted container" in the specification and claims) in which a lid can be easily attached on and detached from a container body. More specifically, the present invention relates to an easily attachable/detachable lid mounted container which is preferably used as a container for housing, storing and transporting thin-plates, such as semiconductor wafers, storage disks, liquid crystal glass substrates and the like.

2. Description of the Related Art

As a conventional easily attachable/detachable lid mounted container, a container disclosed in the Japanese utility model publication No. Hei 6-13114 (No. 13114/1994) entitled "Engagement Mechanism for Sealed Container" is known.

As shown in FIGS. 2 through 4, the sealed container 51 includes generally a container body 52, and a lid 53 for closing the top opening of the container body 52. Each of the two opposed side walls of the lid 53 is provided with an engagement piece 54 which extends downward. The engagement piece 54 has an operation opening 55 formed at the center thereof, and engagement holes 56 formed on the both sides of the operation opening 55. The container body 52 is provided with an engagement member 57 which engages with the engagement hole 56 of the engagement piece 54. The engagement member 57 has an inclined surface 57A which abutting contacts with the engagement piece 54 so as to press the engagement piece 54 outwardly.

In the conventional sealed container having the above configuration, when the lid 53 is placed on the container body 52 and pressed downward from above, the engagement piece 54 slides down along the inclined surface 57A and is thereby spread, whereby the engage member 57 engages with the engagement hole 56. Thereby, the lid 53 is attached on the container body 52 and reliably secured thereon.

When the lid 53 is removed from the container body 52, the engagement pieces 54 are bent. Specifically, the operator seizes, with his hand, the operation opening 55 of each of the engagement pieces 54 and bends the engagement pieces 54 away from each other (i.e. toward the right in FIG. 4), so as to release the engagement hole 56 of the engagement piece 54 from the engagement member 57. Thereafter, the lid 53 is removed from the container body 52.

As described above, when the operator intends to remove the lid 53 from the container body 52, he needs to bend the two engagement pieces 54 away from each other, and to release the engagement holes 56 of the pieces 54 from associated engagement members 57.

However, when the operator lifts the lid 53 upward while bending the engagement pieces 54 away from each other, he must perform the operation of pulling the engagement pieces 54 away from each other, and concurrently the operation of lifting the lid 53 upward. Thus, the conventional container has a poor usability so that work efficiency is very low. Under the circumstances, if the operator removes lids from a small number of containers, he does not have difficulty in removing them. However, if he must remove lids from a large number of containers, he has difficulty in the removing operation because the poor usability of the container imposes a heavy burden on him.

SUMMARY OF THE INVENTION

The present invention is accomplished in view of the above-mentioned problems, and is intended to provide an easily attachable/detachable lid mounted container which facilitates the operation of removing a lid from a container body so as to reduce the burden imposed on the operator.

In order to solve the above-mentioned problems, a first aspect of the present invention provides an easily attachable/detachable lid mounted container including a container body, a lid for covering the container body, and an easy attach/detach mechanism for reliably securing the lid to the container body and for easily detaching the lid from the container body.

The easy attach/detach mechanism includes:

an engagement plate provided on the lid and extending toward the container body, the engagement plate being resilient and bendable;

an object engagement portion, provided on the container body, for engaging, when the lid is pressed toward the container body, with the engagement plate so as to secure the lid to the container body; and separation means, provided between the engagement plate and the object engagement portion, for separating the engagement plate from the object engagement portion when the separation means is pressed toward the container body.

According to the first aspect of the present invention, when the lid is attached on the container body, the lid is covered on the container body and pressed toward the container body. Thereby, the engagement plate of the easy attach/detach mechanism engages with the object engagement portion, whereby the lid is secured to the container body. When the lid is removed from the container body, the separation means is pressed toward the container body so as to separate the engagement plate from the object engagement portion. Thereby, the lid, having been secured to the container body, is released therefrom, and then the lid is removed. In this operation, the forces which the operator needs to apply are only the force for pressing the lid toward the container body and the force for pulling it in the reverse direction. Therefore, the efficiency of the operation of removing the lid is greatly increased.

A second aspect of the present invention provides an easily attachable/detachable lid mounted container, wherein the engagement plate has an engagement hole;

the object engagement portion includes an engagement protrusion which has an inclined surface slidably contacting, when the lid is thus pressed, with the engagement plate so as to spread the engagement plate outwardly and which engages with an engagement hole of the engagement plate thus spread so as to secure the lid to the container body; and the separation means includes a separation plate which is so provided as to slidably contact with the inclined surface of the engagement protrusion and which, when the separation plate is pressed toward the container body, slides along the inclined surface to thereby push the engagement plate outwardly so as to separate the engagement plate from the object engagement portion.

According to the second aspect of the present invention, when the lid is attached on the container body, the lid is covered on the container body and pressed toward the container body. Thereby, the engagement plate is spread by the inclined surface of the object engagement portion and then covers the object engagement portion. Thereafter, when the engagement hole of the engagement plate aligns with the engagement protrusion, the engagement hole engages with the engagement protrusion whereby the lid is secured to the container body. When the lid is removed from the container body, the separation means is pressed toward the container body. Thereby, the separation plate is pressed outwardly along the inclined surface of the engagement protrusion while slidably contacting with the inclined surface, to thereby push the engagement plate outwardly. The engagement plate pushed outwardly disengages from the object engagement portion whereby the lid, having been secured to the container body, is released therefrom. Thereafter, the lid is removed from the container body.

A third aspect of the present invention provides an easily attachable/detachable lid mounted container, wherein the engagement plate has an engagement hole;

the object engagement portion includes an engagement protrusion which has an inclined surface slidably contacting, when the lid is thus pressed, with the engagement plate so as to spread the engagement plate outwardly and which engages with an engagement hole of the engagement plate thus spread so as to secure the lid to the container body; and the separation means includes a separation plate which, when the separation plate is pressed toward the container body, protrudes outwardly to thereby press the engagement plate outwardly so as to separate the engagement plate from the object engagement portion.

According to the third aspect of the present invention, when the lid is removed from the container body, the separation means is pressed toward the container body. Thereby, the separation plate protrudes outwardly, to thereby push the engagement plate outwardly. The engagement plate thus pushed disengages from the engagement protrusion when the engagement hole of the engagement plate disengages from the engagement protrusion. Thereby, the fixation of the lid to the container body is released. Thereafter, the lid is removed. Note that the steps of securing the lid to the container body in the third aspect of the present invention are the same as in the second aspect of the present invention.

A fourth aspect of the present invention provides an easily attachable/detachable lid mounted container, wherein the separation plate is provided with a push-up claw which engages with a lower end portion of the engagement plate so as to push the engagement plate upward.

According to the fourth aspect of the present invention, when the separation plate protrudes outwardly, the pushing-up claw engages with the lower end portion of the engagement plate. Thereafter, the pushing-up claw pushes the engagement plate upward when the separation plate returns to its original position. Thereby, the engagement plate can be released from the engagement protrusion more reliably.

A fifth aspect of the present invention provides an easily attachable/detachable lid mounted container wherein the object engagement portion of the easy attach/detach mechanism includes a recessed portion for housing therein the separation means; and the recessed portion is provided, in the inside thereof, with a filter which allows gas to pass therethrough between the inside and outside of the container so as to equalize the internal and external atmospheric pressures of the container while prohibiting foreign matters from entering the container.

According to the fifth aspect of the present invention, when the external atmospheric pressure changes during transportation and so on of the easily attachable/detachable lid mounted container, the filter equalizes the internal and external atmospheric pressures of the container while prohibiting foreign matters, such as dust and the like, from entering the container. Thereby, the phenomena that the internal atmospheric pressure becomes lower than the external atmospheric pressure and the lid becomes difficult to open can be prevented. As a result, in cooperation with the separation means, efficiency of the operation of removing the lid is further increased.

BRIEF DESCRIPTION OF THE DRAWINGS

Other features, objects and advantages of the present invention will become apparent from the following description of the preferred embodiments with reference to the drawings in which like reference characters designate like or corresponding parts throughout several views, and in which:

FIGS. 1A through 1D are sectional views each showing the main portion of an easy attach/detach mechanism in an easily attachable/detachable lid mounted container according to a first embodiment of the present invention;

FIG. 17 is a sectional view showing the cross section taken on line B—B of FIG. 14;

FIG. 18 is a perspective view showing the main portion of the separation means in the easily attachable/detachable lid mounted container according to the second embodiment of the present invention;

DESCRIPTION OF THE PREFERRED EMBODIMENT

Referring now to the accompanying drawings, preferred embodiments of the present invention will be described below. The easily attachable/detachable lid mounted container according to the present invention is directed to a container in which the work efficiency in the operation of removing the lid from a container is improved. The present invention is preferably applied to a container for housing, storing, and transporting thin-plates, such as semiconductor wafers, storage disks, liquid crystal glasses or the like. The following preferred embodiments will be explained by way of an example of an easily attachable/detachable lid mounted container for housing therein semiconductor wafers.

(A) First Embodiment
(A-1) Configuration of First Embodiment

Figure 2:
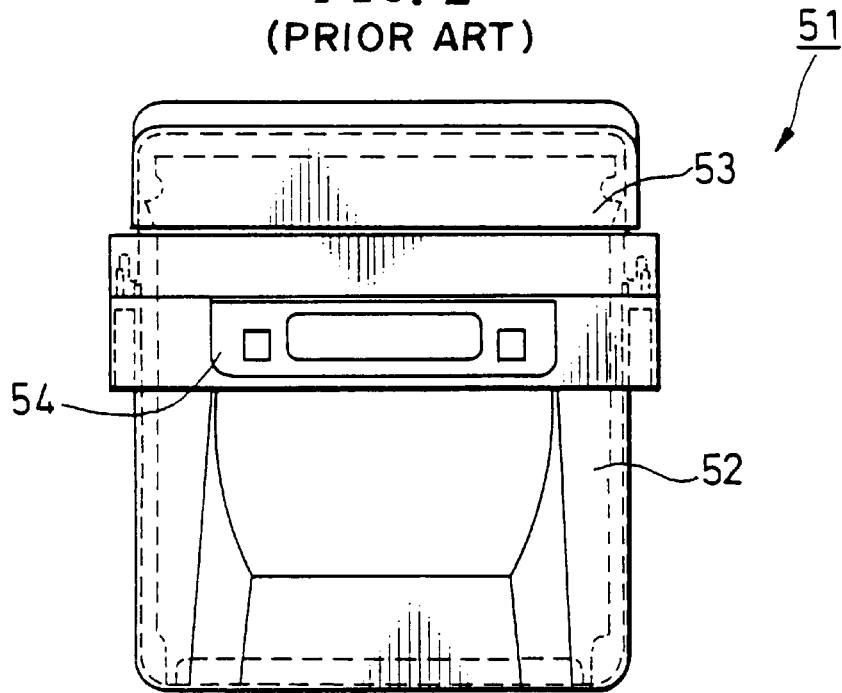
FIG. 2 is a side elevational view showing a conventional sealed container.
Figure 3:
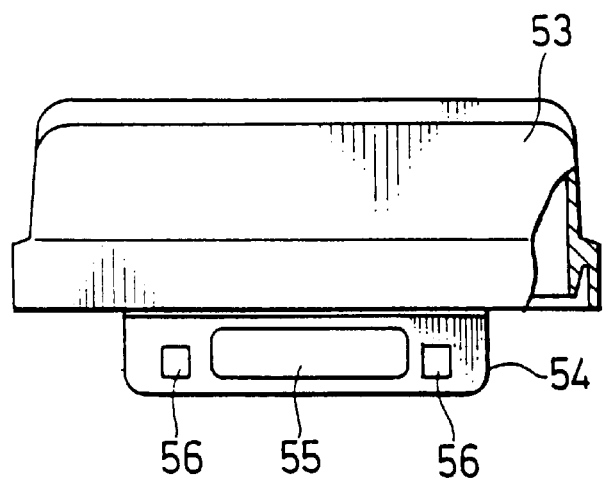
FIG. 3 is a side elevational view showing the lid of the conventional sealed container.
Figure 4:
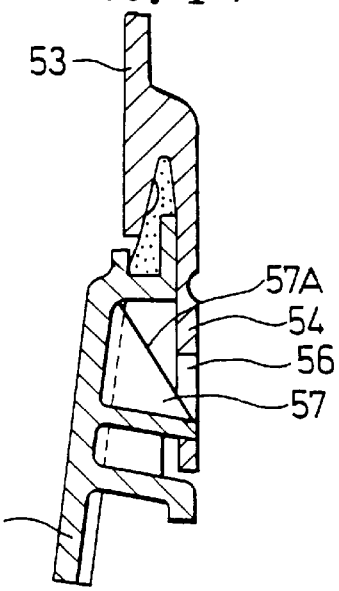
FIG. 4 is a sectional view showing the main portion of a conventional mechanism for securing a lid of the conventional sealed container.
Figure 5:
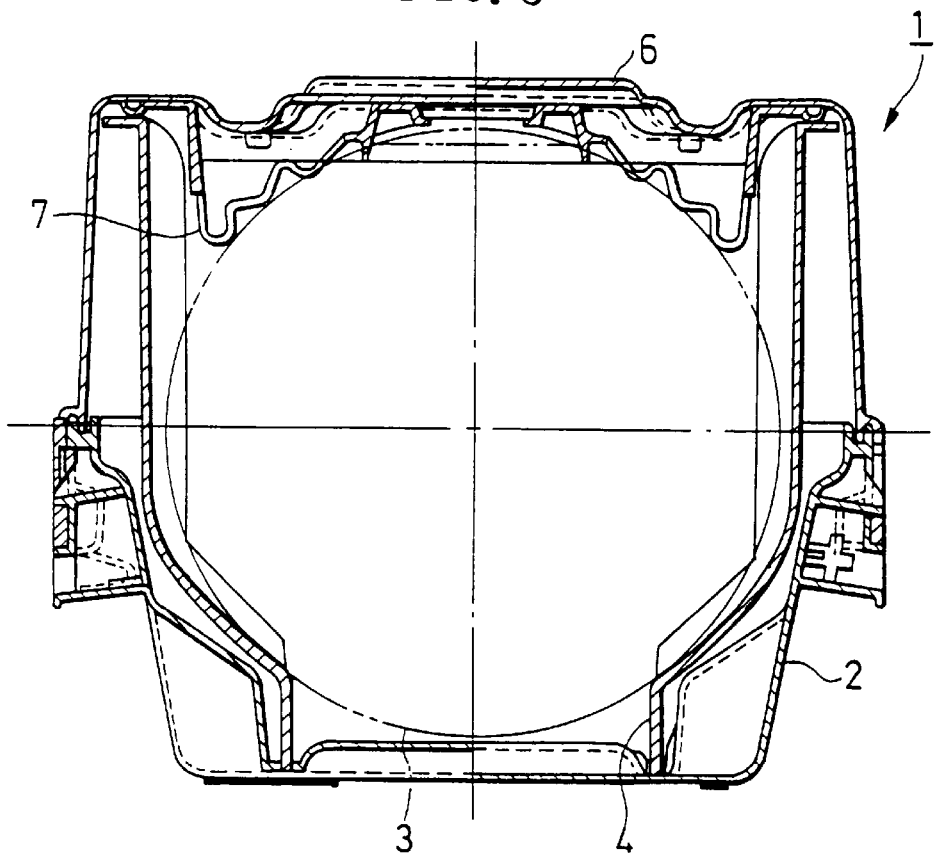
FIG. 5 is a sectional view showing a side cross section of the easily attachable/detachable lid mounted container according to a first embodiment of the present invention.

Referring to FIGS. 1 through 13, a first preferred embodiment of an easily attachable/detachable lid mounted container according to the present invention will be described. The easily attachable/detachable lid mounted container 1 according to the first embodiment of the present invention has the configuration shown in FIGS. 5 through 7. Reference numeral 2 in the drawings denotes a container body. In the container body 2, a plurality of semiconductor wafers 3 are housed in such a manner as to be supported by the wafer carrier 4. Reference numeral 6 denotes a lid for covering the container body 2. The lid 6 is attached on the container body in such a manner as to cover the half upper portions of the semiconductor wafers 3 housed in the container body 2. The inner top surface of the lid 6 is provided with wafer supporting members 7. The wafer supporting members 7 are adapted to support the semiconductor wafers 3 so as to prevent the semiconductor wafers 3 from contacting each other due to vibration during transportation of the easily attachable/detachable lid mounted container 1.

Figure 8:
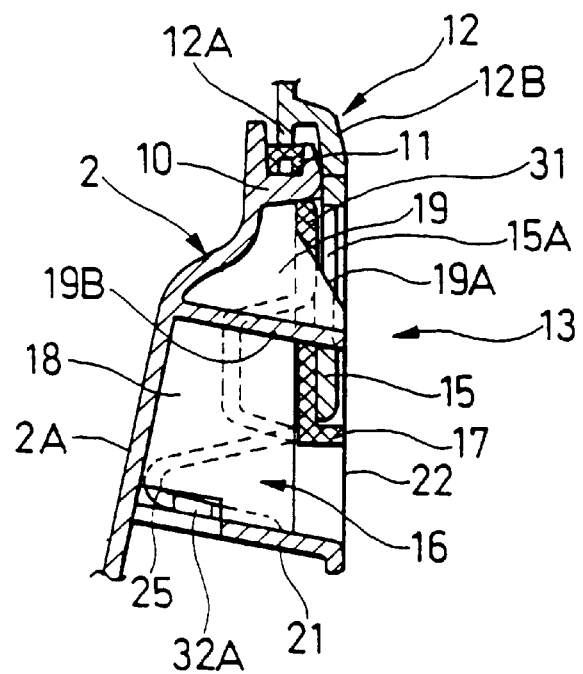
FIG. 8 is a sectional view showing a cross section of the main portion of an easy attach/detach mechanism in the easily attachable/detachable lid mounted container according to the first embodiment of the present invention.

At the upper end portion of the container body 2, a gasket housing groove 10 is formed as shown in FIG. 8. The gasket housing groove 10 is formed along the entire upper rim of the container body 2. The gasket housing groove 10 has an open top structure and houses therein a gasket 11 for tightly sealing the container 1, that is, for prohibiting gas from passing therethrough between the inside and the outside of the container 1. At the lower end portion of the lid 6, an engagement groove 12 which engages with the gasket housing groove 10 is provided. The engagement groove 12 has an open bottom structure and formed along the entire lower rim of the lid 6. The inner wall 12A of the engagement groove 12 is inserted into the gasket housing groove 10 and presses the gasket 11 to thereby form a tight seal. The outer wall 12B of the engagement groove 12 serves as a cover for covering the outside wall of the gasket housing groove 10.

Between the container body 2 and the lid 6, there is provided an easy attach/detach mechanism 13 for reliably securing the lid to the container body 2 and for easily removing the lid from the container body 2. The easy attachment mechanism 13 generally includes an engagement plate 15, an object engagement portion 16 and separation means 17, as shown in FIGS. 6 through 13.

The engagement plates 15 are so formed as to extend from the outer side wall 12B of the engagement groove 12 of the lid 6 toward the container body 2. The engagement plates 15 are provided at four positions on the side walls of the lid 6. At the center of each of the engagement plates 15, an engagement hole 15A adapted to engage with an engagement protrusion 19, which will be described later, is formed. The engagement plate 15 has resiliency and can be bent outwardly (i.e. toward the right in FIG. 8).

Figure 6:
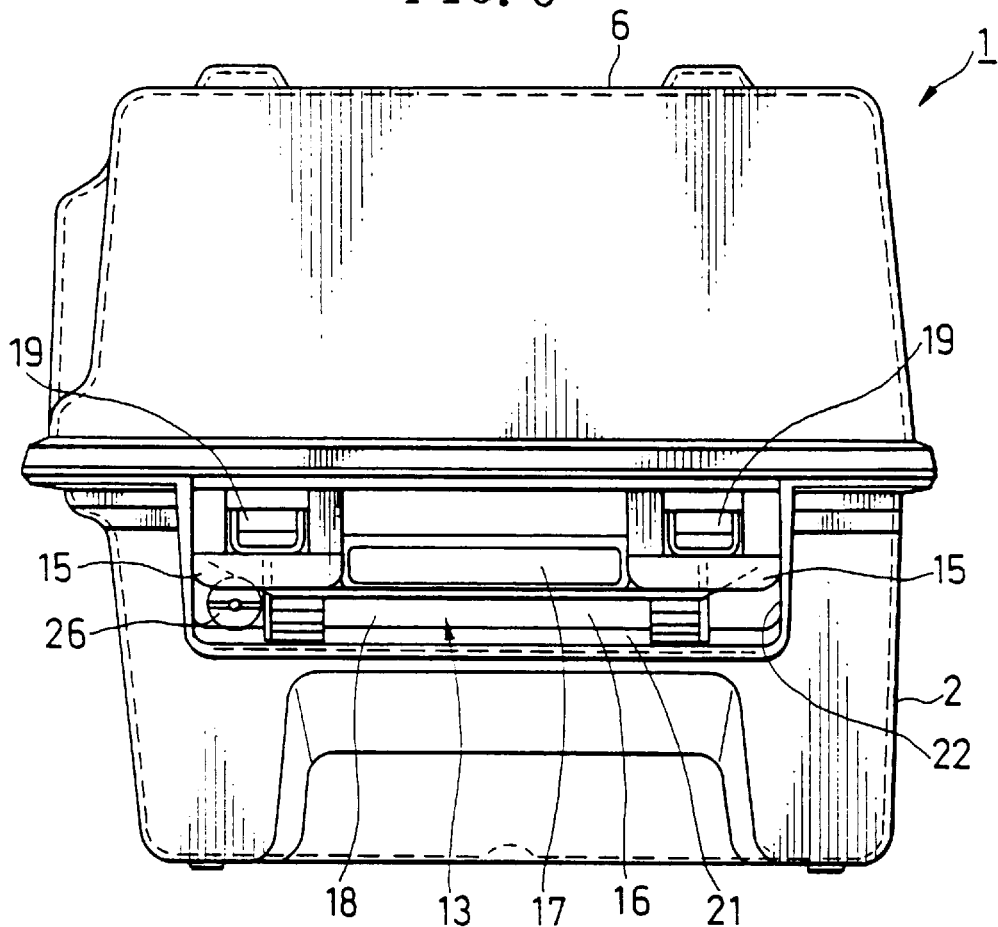
FIG. 6 is an elevational view showing an easily attachable/detachable lid mounted container according to the first embodiment of the present invention.
Figure 7:
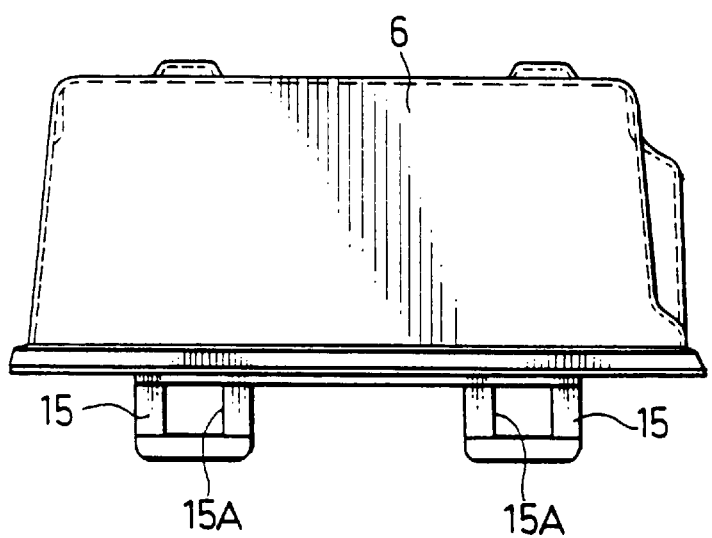
FIG. 7 is a side elevational view showing a lid of the easily attachable/detachable lid mounted container according to the first embodiment of the present invention.

The object engagement portion 16 is provided in the upper portion of the container body 2 at the positions corresponding to the engagement plates 15, as shown in FIGS. 6 through 8. The object engagement portion 16 generally includes a recess 18 and an engaging protrusion 19 provided in the recess 18.

The recess 18 is defined by a side wall 2A of the container body 2, a bottom plate 21, and two side plates 22, and has a rectangular shape a transverse dimension larger than its longitudinal one. Owing to this arrangement, the two engagement plates 15, which are spaced at a given distance from each other, can both be received within the recess 18. In the interior of the recess 18, there are provided engagement protrusions at the positions corresponding to the engagement holes 15A of the engagement plates 15. The engagement protrusions 19 engage with the engagement holes 15A, whereby the lid 6 is secured to the container body 2. Each of the engagement protrusion 19 has an inclined surface 19A at its upper side and an engagement surface 19B at its lower side. The inclined surface 19A is so formed as to protrude outwardly as the inclined surface 19A is traced downwardly. When the lid 6 is covered on the container body 2 and pressed downward from above, the inclined surface 19A forces outwardly the engagement plate 15 which is in contact therewith. Specifically, the engagement plate 15 forces the inclined surface 19A outward so that the engagement plate 15 can slide over the engagement protrusion 19. Thereafter, when the engagement protrusion 19 aligns with the engagement hole 15A, the engagement protrusion 19 engages with the hole 15A. Thereby, the lid 6 is reliably secured to the container body 2 in a state that the engagement surface 19B is in abutting contact with the engagement hole 15A. A long groove 25 is provided at the foot of each of the side plates 22. The long groove 25 engages with an engagement claw 32A of a separation plate 31, which will be described later, so as to directly support the engagement claw 32A and to indirectly support the separation plate 31 fitted into the recess 18.

On one side wall of the recess 18, there is provided a filter 26, as shown in FIGS. 6 through 9. The filter 26 is adapted to allow gas to pass through the side wall of the container body 2 so as to cause the internal atmospheric pressure of the container to be equal to the external atmospheric pressure thereof and to prohibit foreign matter, such as the dust or the like, from passing therethrough. The filter 26 is attached in such a manner that the filter 26 is fitted to the pipe 27 provided on the side wall 2A of the container body 2 and that the filter 26 does not protrude out of the recess 18.

Figure 9:
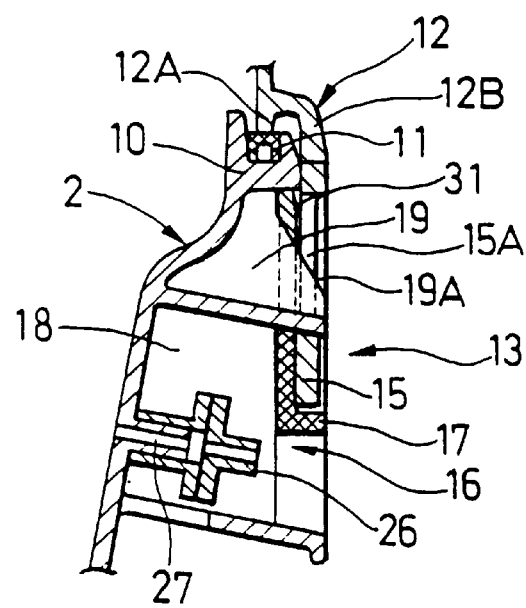
FIG. 9 is a view showing another cross section of the main portion of the easy attach/detach mechanism in the easily attachable/detachable lid mounted container according to the first embodiment of the present invention.
Figure 10:
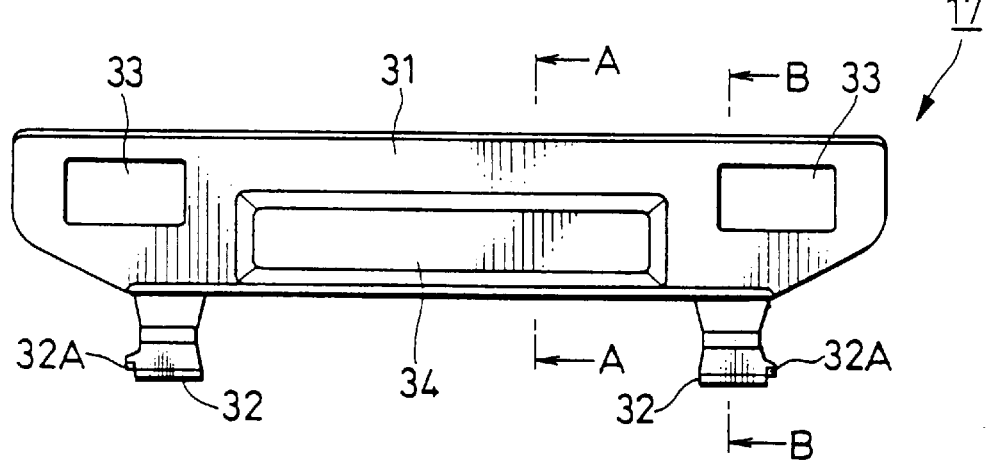
FIG. 10 is an elevational view showing separation means in the easily attachable/detachable lid mounted container according to the first embodiment of the present invention.
Figure 11:
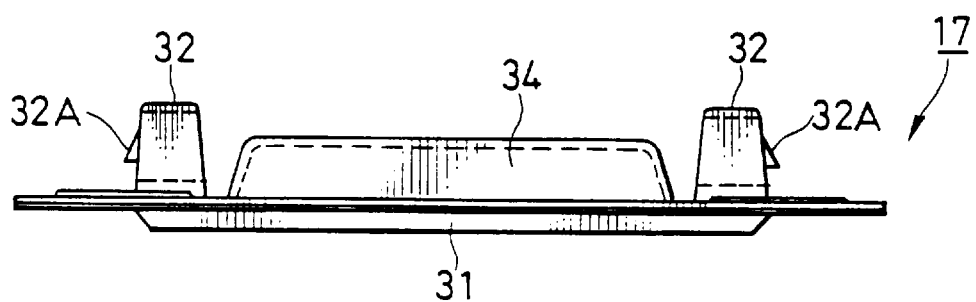
FIG. 11 is a plan view showing the separation means in the easily attachable/detachable lid mounted container according to the first embodiment of the present invention.
Figure 12:
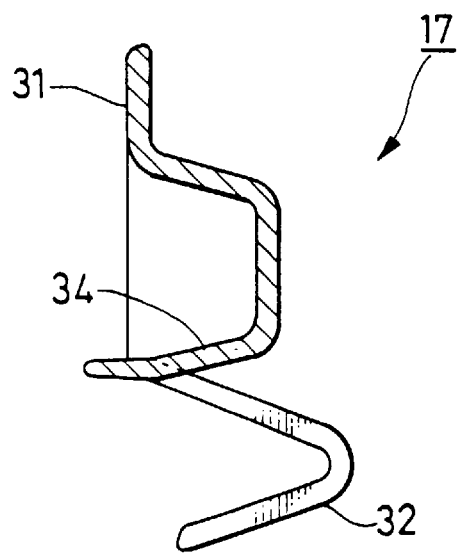
FIG. 12 is a sectional view showing the cross section taken on line A—A of FIG. 10.
Figure 13:
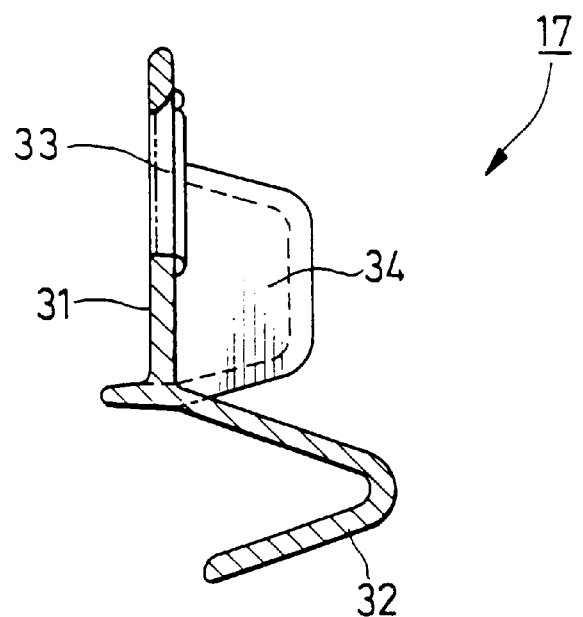
FIG. 13 is a sectional view showing the cross section taken on line B—B of FIG. 10.
Figure 14:
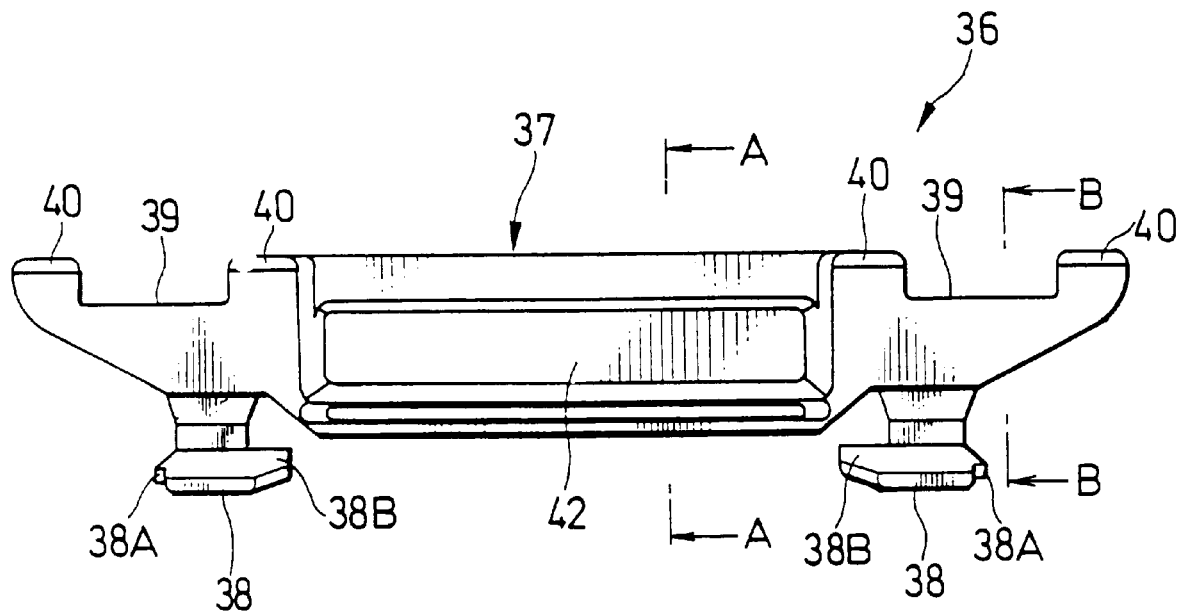
FIG. 14 is an elevational view showing an elevation of separation means in the easily attachable/detachable lid mounted container according to a second embodiment of the present invention.
Figure 15:
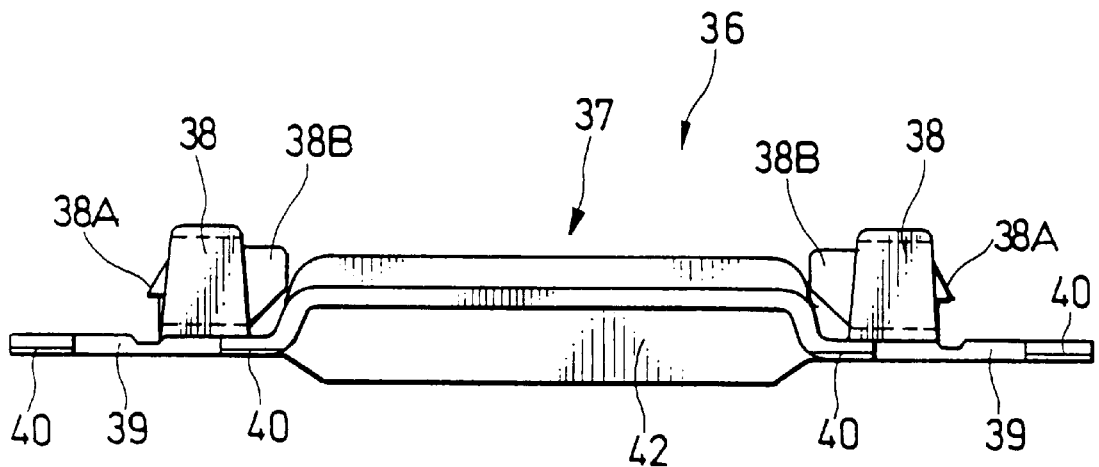
FIG. 15 is a plan view showing the separation means in the easily attachable/detachable lid mounted container according to the second embodiment of the present invention.
Figure 16:
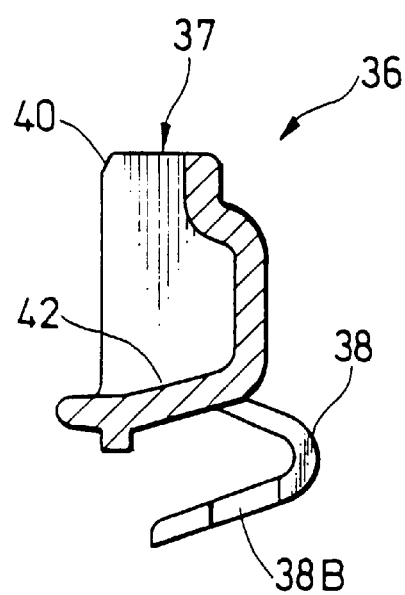
FIG. 16 is a sectional view showing the cross section taken on line A—A in FIG. 14.

The separation means 17 is adapted to be pressed toward the container body 2 (i.e. downward) so as to separate the engagement plate 15 from the engagement protrusion 19 of the object engagement portion 16. The separation means 17 includes a separation plate 31 and leg portions 32, as shown in FIGS. 8 through 13. The separation plate 31 has such a size as to be accomodated in the recess 18 and a substantially rectangular shape with a transverse dimension larger than its longitudinal dimension. The opposite edge portions of the separation means 17 are formed with engagement holes 33 each of which engages with the engagement protrusion 19. The engagement holes 33 are adapted to enable the separation plate 31 to be interposed between the engagement protrusion 19 and the engagement plate 15 while keeping the engagement protrusion 19 engaged with the engagement hole 15A of the engagement plate 15. The state in which the separation plate 31 is interposed between the engagement protrusion 19 and the engagement plate 15 is shown in FIGS. 8 and 9. In this state, when the separation plate 31 is pressed downward, the separation plate 31 is pressed outwardly (i.e. toward the right in FIGS. 8 and 9) while sliding along the inclined surface 19A of the engagement protrusion 19, to thereby release the engagement plate 15 from the engagement protrusion 19. At the center of the separation plate 31, there is provided a pressing recess 34 through which the operator inserts his hand to press the separation plate 31 downward.

The leg portion 32 serves as a spring for pressing back the separation plate 31, which has been pressed downward (i.e. toward the container body 2), upward (i.e. toward the lid 6). The leg portions 32 are each composed of a resilient L-shaped member and provided at two positions at the lower portion of the separation plate 31. In each of the leg portions 32, there is provided an engagement claw 32A formed at the outside edge of the leg portion 32 and extending transverse to the leg portion 32. The engagement claws 32A are adapted to engage with the long grooves 25 so as to support the separation means 17 within the recess 18, as shown in FIG. 8. As shown in FIGS. 1A and 1B, when the separation means 17 is pushed into the recess 18 while aligning the engagement protrusions 19 with the leg portions 32, the engagement claws 32A of the leg portions 32 engage with the long grooves 25, whereby the separation means 17 is attached within the recess 18.

(A-2) Operation of First Embodiment

In the easily attachable/detachable lid mounted container 1, the lid 6 is attached to and removed from the container body 2 in the following manner.

When the lid 6 is attached on the container body 2, the lid 6 is covered on the container body 2 and pressed downward (i.e. toward the container body 2). Thereby, the engagement plate 15 engages with the object engagement portion 16. Specifically, as the lid 6 is pressed downward, the engagement plate 15 moves downward and spreads outwardly with its tip slidably contacting with the inclined surface 19A of the engagement protrusion 19 of the object engagement portion 19, to thereby cover the engagement protrusion 19. Thereafter, when the engagement hole 15A of the engagement plate 15 aligns with the engagement protrusion 19, the engagement hole 15A engages with the engagement protrusion 19 whereby the lid 6 is secured to the container body 2.

When the lid 6 is removed from the container body 2, the pressing recess 34 of the separation means 17 is pushed downward, as shown in FIGS. 1C and 1D, so as to move the separation plate 31 downward. Thereby, the separation plate 31 interposed between the engagement protrusion 19 and the engagement plate 15 is pressed outwardly along the inclined surface 19A of the engagement protrusion 19. As the engagement plate 15 is pressed outwardly, the engagement hole 15A moves slidably on the engagement surface 19B, and finally disengages from the engagement surface 19B. Thereby, the engagement plate 15 is released from the engagement protrusion 19, whereby the lid 6 is slightly displaced upward by means of the resilient forces of the gasket 11 and the engagement plate 15. Thus, the lid 6, having been secured to the container body 2, is released therefrom. Thereafter, the lid 6 is lifted upward and removed from the container body 2.

Meanwhile, the atmospheric pressure around the easily attachable/detachable lid mounted container 1 sometimes changes during transportation. In such a case, the filter 26 operates to make the internal atmospheric pressure of the container equal to the external atmospheric pressure thereof while prohibiting dust or the like from entering the container 1. Thereby, the internal and external atmospheric pressures of the container 1 are always kept equal. As a result, phenomena that the internal atmospheric pressure becomes lower than the external atmospheric pressure and the lid 6 becomes difficult to open can be prevented.

(A-3) Advantages of First Embodiment

According to the first embodiment, the operations that the operator need to perform in attaching and detaching the lid 6 to and from the container body 2 are only the operation of pressing the lid 6 with his weight applied thereon, the operation of pressing the separation means 17 downward, and the operation of lifting the lid 6 upward. Thus, the operator does not need to apply forces in the transversal directions. Thereby, efficiency in the operations of attaching and detaching the lid 6 is greatly increased.

Further, owing to the filter 26, the phenomena that the internal atmospheric pressure of the easy attachment lid-mounted container 1 becomes lower than the external atmospheric pressure thereof, and thereby the lid becomes difficult to open is prevented. Accordingly, efficiency in detaching the lid 6 is greatly increased.

Furthermore, the filter 26 is housed inside the recess 18 and no portion of the filter 26 protrudes out of the recess 18. Owing to this configuration, the problem that the filter 26 comes into contact with something and is broken during transportation of the easily attachable/detachable lid mounted container 1 can be reliably prevented.

(B) Second Embodiment

Next, referring to FIGS. 14 through 19B, a second embodiment of an easily attachable/detachable lid mounted container according to the present invention will be described below.

(B-1) Configuration of Second Embodiment

The overall configuration of the easily attachable/detachable lid mounted container of the second embodiment is almost the same as that of the first embodiment. Therefore, like or corresponding parts or members are denoted by like reference characters or numbers and the explanations therefor are omitted. The characteristic features of the easily attachable/detachable lid mounted container according to the second embodiment lie in the separation means 36. The separation means 36 will be described referring to FIGS. 14 through 19B.

Figure 19A:
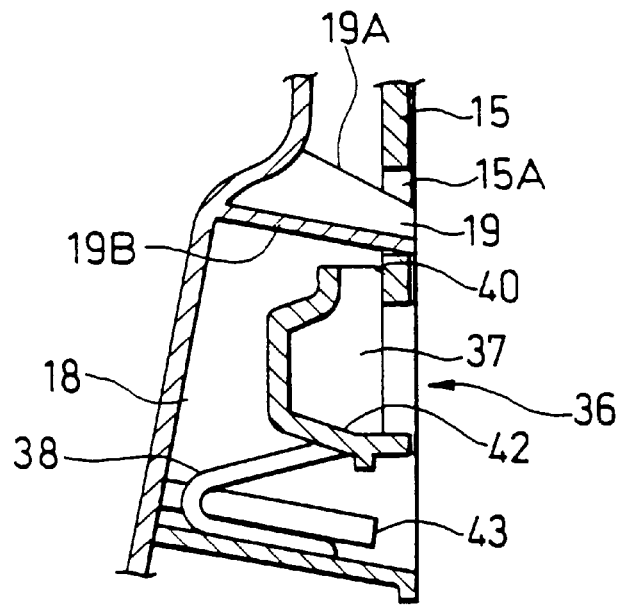
FIGS. 19A and 19B are sectional views each showing the main portion of the easy attach/detach mechanism in the easily attachable/detachable lid mounted container according to the second embodiment of the present invention.

The separation means 36 is composed of a separation plate 37 and a leg portion 38. The separation plate 37 has such a size as to be accomodated in the recess 18 and a shape substantially identical to that of the separation plate 31 of the first embodiment. At both end portions in the separation plate 37, notches 39 each of which engages with the engagement protrusion 19 from below are formed. Each of the notches 39 is adapted to engage with the lower portion of the engagement protrusion 19 in a state that the engagement protrusion 19 is engaged with the engagement hole 15A of the engagement plate 15, whereby the separation plate 37 is positioned inside the engagement plate 15. FIG. 19A shows the state in which the separation plate 37 is positioned inside the engagement plate 15, with the engagement protrusion 19 engaged with the engagement plate 15. In the separation plate 37, areas formed on both sides of each of the notches 39 serve as pressing portions 40 for pressing the engagement plate 15 from inside. Reference numeral 42 denotes a pressing recess. When the operator inserts his hand into the pressing recess 42 and pushes the separation plate 31 downward (i.e. toward the container body 2), the separation plate 37 rotates and the pressing portion 40 protrudes outwardly. The pressing portion 40 pushes the engagement plate 15 outwardly from inside, so as to release the engagement plate 15 from the engagement protrusion 19.

The leg portion 38 serves as a spring which supports the rotation of the separation plate 37 and pushes back the separation plate 37, having been pushed downward (i.e. toward the container body 2) and thereby rotated, to its original position. The leg portion 38 are made of resilient plate-shaped material and provided at two positions in the lower portion of the separation plate 37. The leg portion 38 is L-shaped, similarly to the leg portion 32 of the first embodiment. The leg portion 38 of the second embodiment is different from the leg portion 32 of the first embodiment in the following respect. Specifically, the leg portion 32 of the first embodiment supports the separation plate 31 while allowing the separation plate 31 to perform downward parallel movement. In contrast, the leg portion 38 of the second embodiment supports the separation plate 37 while allowing the separation plate 37 to rotate. The leg portions 38, which support the rotation of the separation plate 37, move large compared with the leg portions 32, which support the parallel movement of the separation plate 31, and accordingly the leg portions 38 are more liable to slip out than the leg portions 32. For this reason, the leg portions 38 are so configured as to be reliably supported. Specifically, each of the leg portion 38 is provided with an engagement claw 38A and a protruded portion 38B. The engagement claw 38A extends from the outside edge of the leg portion 38 transverse to the leg portion 38, similarly to the engagement claw 32A of the first embodiment. The protruded portion 38B extends from the inside edge of the leg portion 38 transverse to the leg portion 38. The protruded portion 38B is adapted to be supported between a leg portion presser plate 43, which will be described later, and the bottom plate of the recess 18. Owing to the engagement claw 38A and the protruded portion 38B, the leg portion 38 is reliably secured within the recess 18. Therefore, even when the separation plate 37 rotates and the leg portion 38 moves large, the separation means 36 does not slip out of the recess 18.

When the separation means 36 is pushed into the recess 18 while positioning the protruded portion 38B between the leg portion presser plate 43 and the recess 18, the engagement claw 38A engages with the long groove 25, and the protruded portion 38B is inserted into the space formed between the leg portion presser plate 43 and the bottom plate of the recess 18. Thus, the separation means 36 is attached within the recess 18.

The leg portion presser plate 43 extends from the innermost wall of the recess 18, as shown in FIGS. 18 and 19. The leg portion presser plates 43 are provided at two positions where the upper surfaces of the protruded portions 38B of the respective leg portions 38 are covered. The distance between the leg portion presser plate 43 and the bottom plate of the recess 18 is so set as to be substantially the same as the thickness of the protruded portion 38B of the leg portion 38.

(B-2) Operation of Second Embodiment

In the easily attachable/detachable lid mounted container of the second embodiment having the above-mentioned configuration, the lid 6 is removed from the container body 2 in the following manner. Note that the steps of attaching the lid 6 is the same as in the first embodiment.

Figure 19B:
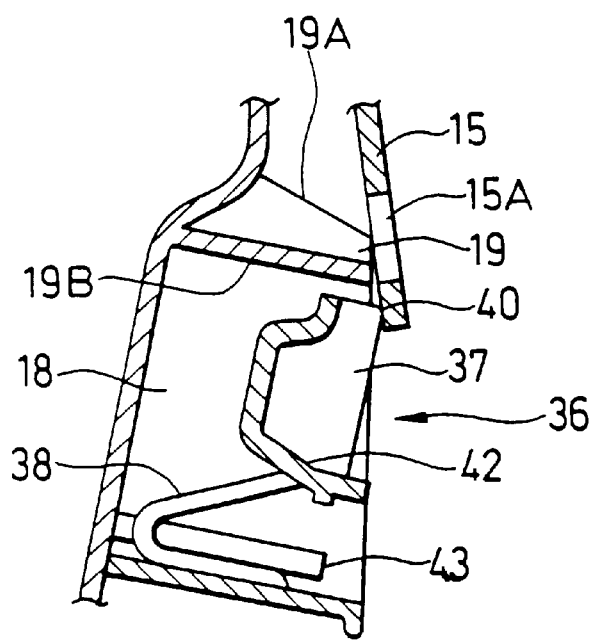

When the lid 6 is detached from the container body 2, the pressing recess 42 of the separation means 36 is pressed downward so as to rotate the separation plate 37, as shown in FIGS. 19A and 19B. Thereby, the pressing portion 40 of the separation plate 37 protrudes outwardly, to thereby push the engagement plate 15 outwardly. As the engagement plate 15 is pushed outwardly, the engagement hole 15A moves slidably on the engagement surface 19B and finally disengages from the engagement surface 19B. Thereby, the engagement plate 15 is released from the engagement protrusion 19, whereby the lid 6 is slightly displaced upward by means of the resilient forces of the gasket 11 and so on. Thus, the lid 6, having been secured on the container body 2, is released therefrom. Thereafter, the lid 6 is lifted upward and removed from the container body 2.

(B-3) Advantages of Second Embodiment

Owing to the above-described configuration and operations, the easily attachable/detachable lid mounted container according to the second embodiment exhibits the same advantages as in the easily attachable/detachable lid mounted container 1 of the first embodiment.

Figure 20:
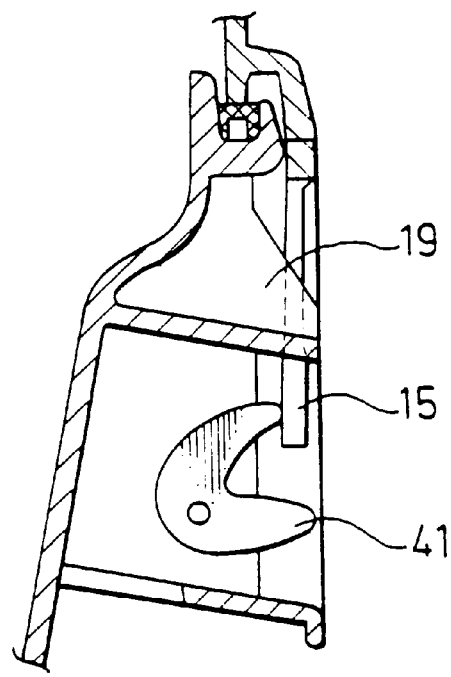
FIG. 20 is a sectional view showing the main portion of a first modification.

(C) Modifications (C-1) In the first embodiment, as the separation means, the separation plate 31 which slidably moves up and down is employed. Alternatively, as shown in FIG. 20, an extruding cam 41 having an L-shaped side surface may be employed. In this configuration, the extruding cam 41 is pressed downward and thereby rotated so as to push the engagement plate 15 outwardly whereby the engagement plate 15 is released from the engagement protrusion 19. This configuration also exhibits the same operations and advantages as in the above-mentioned preferred embodiments.

(C-2) In the first embodiment, the engagement protrusion 19 is provided on the container body 2. Alternatively, there may be employed a configuration in which the engagement protrusion 19 is on the engagement plate 15, and the engagement hole to be engaged with the engagement protrusion 19 is provided on the container body 2. This configuration also exhibits the same operations and advantages as the above-mentioned preferred embodiments.

Figure 21:
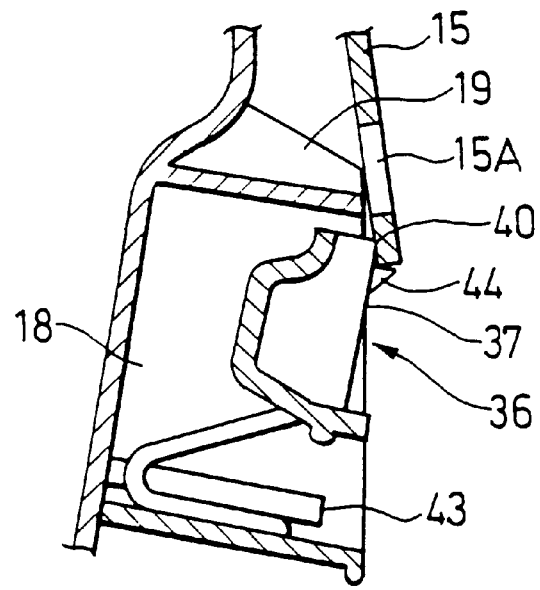
FIG. 21 is a sectional view showing the main portion of a second modification.

(C-3) In the second embodiment, when the engagement plate 15 is separated from the engagement protrusion 19, the lid 6 is displaced upward by means of the resilient forces of the gasket 11 and so on. Alternatively, as shown in FIG. 21, there may be provided a pushing-up claw 44 at the pressing portion 40 of the separation plate 37. In this configuration, the pressing portion 40 protrudes outwardly, and thereby the pushing-up claw 44 engages with the lower end portion of the engagement plate 15. At this time, the resilient force of the engagement plate 15 forces the engagement plate 15 to restore its original state, whereby the lower end portion of the engagement plate 15 is reliably engaged with the pushing-up claw 44. Thereafter, when the resilient force of the leg portions 38 forces the separation plate 37 to return to its original position, the separation plate 37 pushes the engagement plate 15 upward. Thereby, the engagement plate 15 can be removed from the engagement protrusion 19 more reliably.

(D) Advantages of the Invention

As described in detail, according to the easily attachable/detachable lid mounted container of the present invention, by performing the operation of pressing the lid toward the container body, the operation of pressing the separation means toward the container body, and the operation of lifting the lid upward, the operator can attach and/or remove the lid with respect to the container body. As a result, he does not need to apply forces in the transversal directions, and accordingly efficiency in the operations of attaching and detaching the lid is markedly increased.

Further, owing to the filter, the internal and external atmospheric pressures of the easily attachable/detachable lid mounted container can be kept equal, and accordingly efficiency in the operation of removing the lid is further increased.

Further, since the filter is housed in the recess, the problem that the filter comes into contact with something and is broken during transportation of the easily attachable/detachable lid mounted container can be prevented.

While the present invention has been disclosed in terms of preferred embodiments in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. An easily attachable/detachable lid mounted container including a container body having a recess, a lid for covering said container body, and an easy attach/detach mechanism for reliably securing said lid to said container body and for easily detaching said lid from said container body, said easy attach/detach mechanism comprising:

an engagement plate provided on said lid and extending toward said container body, said engagement plate being resilient and bendable;

engaging means, provided on said container body, for engaging, when said lid is pressed in a lid seating direction toward said container body, with said engagement plate so as to secure said lid to said container body;

separation means, mounted in said recess and extending between said engagement plate and said engaging means, for separating said engagement plate from said engaging means when said separation means is pressed in said lid seating direction; and a filter mounted within said recess and extending through a wall of said container body to allow gas to pass through said wall thereby equalizing internal pressure within said container with atmospheric pressure external to said container, while prohibiting foreign matter from entering the container.

2. An easily attachable/detachable lid mounted container according to claim 1, wherein said engagement plate has an engagement hole;

said engaging means includes an engagement protrusion which has an inclined surface on which said engagement plate slides when said lid is pressed in said lid seating direction, to thereby force said engagement plate to bend outwardly, away from said container body, until said engagement hole of said engagement plate aligns with and is engaged by said engagement protrusion so as to secure said lid to said container body; and said separation means includes a separation plate which is slidably mounted for contact with the inclined surface of said engagement protrusion and which, when pressed in said lid seating direction, slides along the inclined surface to thereby push said engagement plate outwardly so as to separate said engagement plate from said engagement protrusion.

3. An easily attachable/detachable lid mounted container including a container body, a lid for covering said container body, and an easy attach/detach mechanism for reliably securing said lid to said container body and for easily detaching said lid from said container body, said easy attach/detach mechanism comprising:

an engagement plate provided on said lid and extending toward said container body, said engagement plate being resilient and bendable and having an engagement hole;

an engagement protrusion which has an inclined surface on which said engagement plate slides as said lid is pressed in a lid seating direction, toward said container body, to thereby force said engagement plate to bend outwardly, away from said container body, until said engagement hole of said engagement plate aligns with and is engaged by said engagement protrusion so as to secure said lid to said container body; and a separation element pivotally mounted on said container body with a pressing portion extending between said container body and said engagement plate, said separation element including means for pushing said separation element in said lid seating direction to cause said separation element to rotate with movement of said pressing portion away from said container body and against said engagement plate, thereby releasing said engagement plate from said engagement protrusion.

4. An easily attachable/detachable lid mounted container according to claim 3, wherein said separation plate is provided with a push-up claw which engages with a lower end portion of said engagement plate so as to bias the engagement plate in a direction opposite to said lid seating direction.

5. An easily attachable/detachable lid mounted container according to claim 3, wherein said container body includes a recessed portion housing said separation element; and said recessed portion is provided, in the inside thereof, with a filter which allows gas to pass therethrough between the inside and outside of the container so as to allow internal pressure within said container to equalize with atmospheric pressure external to said container, while prohibiting foreign matters from entering the container.

6. An easily attachable/detachable lid mounted container according to claim 3, wherein said container body includes a recessed portion housing said separation means; and said recessed portion is provided, in the inside thereof, with a filter which allows gas to pass therethrough between the inside and outside of the container so as to allow internal pressure within said container to equalize with atmospheric pressure external to said container, while prohibiting foreign matters from entering the container.

* * * * *